(12) United States Patent
Adler et al.

(10) Patent No.: US 7,315,022 B1
(45) Date of Patent: Jan. 1, 2008

(54) HIGH-SPEED ELECTRON BEAM INSPECTION

(75) Inventors: David L. Adler, San Jose, CA (US); Mark A. McCord, Los Gatos, CA (US); Mehdi Vaez-Iravani, Los Gatos, CA (US); Liqun Han, Fremont, CA (US); Kirk J. Bertsche, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 189 days.

(21) Appl. No.: 11/031,091

(22) Filed: Jan. 6, 2005

Related U.S. Application Data

(60) Provisional application No. 60/621,996, filed on Oct. 25, 2004, provisional application No. 60/598,178, filed on Aug. 2, 2004.

(51) Int. Cl.
*H01J 37/20* (2006.01)
*G01R 31/28* (2006.01)
(52) U.S. Cl. ............ 250/310; 250/306; 250/307; 250/397
(58) Field of Classification Search ............... 250/310
See application file for complete search history.

(56) References Cited

U.S. PATENT DOCUMENTS

| 3,660,278 | A | 5/1972 | Mimura et al. |
| 4,871,539 | A | 10/1989 | Hata et al. |
| 5,502,306 | A | 3/1996 | Meisburger et al. |
| 6,465,781 | B1 * | 10/2002 | Nishimura et al. ......... 250/306 |
| 6,524,873 | B1 * | 2/2003 | Satya et al. .................. 438/16 |
| 6,566,897 | B2 * | 5/2003 | Lo et al. ..................... 324/751 |
| 6,618,134 | B2 * | 9/2003 | Vaez-Iravani et al. ... 356/237.4 |
| 6,636,302 | B2 | 10/2003 | Nikoonahad et al. |
| 6,673,637 | B2 | 1/2004 | Wack et al. |
| 6,818,211 | B2 | 11/2004 | Tisinger et al. |
| 6,872,942 | B1 * | 3/2005 | Adler ......................... 250/306 |
| 2002/0027440 | A1 * | 3/2002 | Shinada et al. ............. 324/751 |
| 2003/0008382 | A1 | 1/2003 | Tisinger et al. |

FOREIGN PATENT DOCUMENTS

| WO | 2004/056975 A2 | 7/2004 |
| WO | 2004/056975 A3 | 7/2004 |

OTHER PUBLICATIONS

Stan Stokowski et al., "Wafer Inspection Technology Challenges for ULSI Manufacturing" KLA-Tencor, Milpitas, CA.*
Stan Stokowski, et al. "Wafer inspection technology challenges for ULSI manufacturing", 11 sheets, KLA-Tencor, Milpitas, California.

* cited by examiner

*Primary Examiner*—David Vanore
*Assistant Examiner*—James J Leybourne
(74) *Attorney, Agent, or Firm*—Okamoto & Benedicto LLP

(57) ABSTRACT

One embodiment disclosed relates to an electron beam apparatus for inspection of a semiconductor wafer, wherein substantially an entire area of the wafer surface is scanned without moving the stage. A cathode ray tube (CRT) gun may be used to rapidly (and cost effectively) scan the beam over the wafer. Another embodiment disclosed relates to a high-speed automated e-beam inspector configured to scan the e-beam in one dimension while translating the wafer in a perpendicular direction. The translation may be linear, or alternatively, may be in a spiral path. Other embodiments are also disclosed.

16 Claims, 4 Drawing Sheets

200 ated electron beam inspection in accordance with an embodiment of the invention.

HIGH-SPEED ELECTRON BEAM INSPECTION

CROSS-REFERENCE TO RELATED APPLICATIONS

The present application claims the benefit of U.S. Provisional Patent Application No. 60/598,178, entitled "Macro E-Beam Inspector with CRT-Type Optics," filed Aug. 2, 2004, by inventors David L. Adler, Mark McCord, Mehdi Vaez-Irvani and Liqun Han, the disclosure of which is hereby incorporated by reference. In addition, the present application claims the benefit of U.S. Provisional Patent Application No. 60/621,996, entitled "High-Speed Electron Beam Inspection," filed Oct. 25, 2004, by inventors David L. Adler, Mark A. McCord, Mehdi Vaez-Irvani, Liqun Han, and Kirk J. Bertsche, the disclosure of which is hereby incorporated by reference. The present application is related to U.S. patent application Ser. No. 10/701,857, entitled "High-Speed Inspection of Flat Substrates with Underlying Visible Topology," filed Nov. 5, 2003, by inventor David L. Adler, the disclosure of which is hereby incorporated by reference.

BACKGROUND OF THE INVENTION

1. Field of the Invention

The present invention relates to electron beam (e-beam) inspection equipment.

2. Description of the Background Art

Inspection tools are used during the semiconductor manufacturing process to increase and maintain integrated circuit yields. Conventional inspection tools are typically implemented to use an x-y stage in order to position a region of interest of the sample under the beam. In some implementations, time-delay-integration (TDI) detectors may be used so that the substrate may be continuously moved under the beam.

The conventional technique for positioning a region of interest has disadvantages relating to cost, complexity and reliability of the moving stage. Moreover, the conventional technique has a relatively slow throughput rate for inspecting wafers due to the need to reposition (or continuously move) the wafer under the beam. In addition, the size of the stage makes it difficult to integrate the inspector into another semiconductor equipment tool for in-situ metrology applications.

It is desirable to improve electron beam inspection equipment and techniques. It is particularly desirable to increase the throughput of e-beam inspection of semiconductor wafers and other substrates.

SUMMARY

One embodiment of the invention relates to an electron beam apparatus for inspection of a semiconductor wafer, wherein substantially an entire area of the wafer surface is scanned without moving the stage. A cathode ray tube (CRT) gun may be used to rapidly (and cost effectively) scan the beam over the wafer.

Another embodiment relates to a high-speed automated e-beam inspector configured to scan the e-beam in one dimension while translating the wafer in a perpendicular direction. The translation may be linear, or alternatively, may be in a spiral path.

Other embodiments of the invention are also disclosed herein.

These drawings are used to facilitate the explanation of embodiments of the present invention. The drawings are not necessarily to scale.

DETAILED DESCRIPTION

Traditional optical methods are available for macro wafer inspection, but these optical methods are not sensitive to electrical properties. Electron beam inspection tools are available, but these tools are currently too slow to be practical for wafer-level mapping on the order of several to tens of wafers per hour.

Advantageously, an embodiment of the invention allows very high speed inspection of large defects, film properties, or process variations on wafers (or other substrates) that may not be seen using traditional optical inspection, and for which current electron beam techniques are too slow to be practical.

Various techniques for such high-speed e-beam inspection are discussed herein. In a first technique, CRT technology is used to construct a two-dimensional scanning apparatus that can scan over a wafer without a moving stage. In a second technique, a one-dimensional scanning apparatus with a one-dimensional linear moving stage is used to scan over a wafer. In a third technique, a swath scanning apparatus with a spiral-motion (r-θ) stage is used to scan over a wafer.

Figure 1:
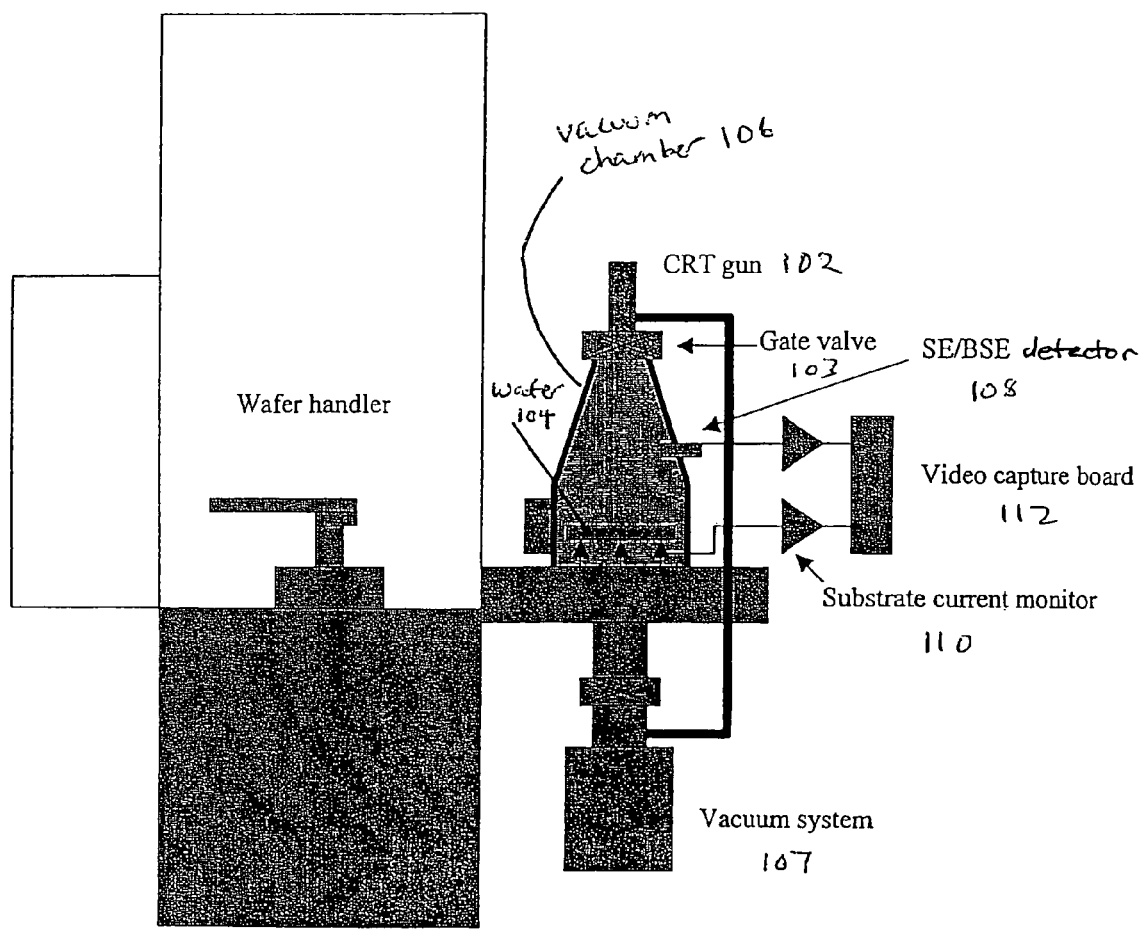
FIG. 1 is a schematic diagram of a high-speed two-dimensional scanning apparatus for automated electron beam inspection in accordance with an embodiment of the invention.

FIG. 1 is a schematic diagram of a high-speed two-dimensional scanning apparatus 100 for automated electron beam inspection in accordance with an embodiment of the invention. The two-dimensional scanning apparatus 100 may be called a "macro" e-beam inspector with CRT-type optics.

The two-dimensional scanning apparatus 100 is configured to advantageously utilize a cathode ray tube (CRT) gun 102 and deflection technology. A gate valve 103 may also be used, as shown in FIG. 1. The inspector may be configured to scan over an entire wafer 104 (for example, a 300 mm wafer) without using any physically moving parts. The scan is achievable without physically moving parts because no stage motion is needed during the scan. The beam from the CRT gun 102 is instead deflected in a two-dimensional pattern, such as a raster pattern of a television. In other words, the stage holding the wafer may be stationary during the scanning of the wafer surface.

In one embodiment, the wafer may be pre-aligned and loaded into the vacuum chamber 106 (shown pumped by the vacuum system 107) under the electron beam optics. The e-beam may then be scanned in two dimensions over the entire wafer and a two-dimensional image constructed. For example, the two-dimensional scanning may use a raster scan pattern or other pattern. The scan pattern to be used may be programmed into a controller that controls the deflection of the beam from the CRT gun 102.

The signal may be taken from one (or more) of several mechanisms, including secondary electrons (SE), backscattered electrons (BSE), low-loss energy electrons, substrate current, and/or an x-ray signal. In one particular embodiment, a combination of secondary imaging and substrate imaging may provide detailed information in a novel way. In the embodiment illustrated in FIG. 1, a signal from the SE/BSE detector 108 and a signal from the substrate current monitor 110 are both fed into a video capture board 112. A processor may be configured to process the scattered electron and substrate current signals so as to map wafer properties. The wafer properties may include those other than those pertaining to contact or via holes of the wafer. Various other wafer properties may be mapped using this technique, including, for example, gate breakdown or junction leakage.

The beam current for the system of FIG. 1 may be advantageously large and in a range of one to one thousand (1 to 1000) microamperes, for example. In contrast, conventional electron beam equipment for semiconductor wafer inspection and metrology applications utilize electron beam currents in the range of a few picoamperes to a few hundred nanoamperes. This is because prior equipment use electron cathodes designed for high resolution but low current applications. These cathodes typically comprise sharp needles or hairpins of tungsten or lanthanum hexaboride. To achieve the much higher currents in a focused beam as preferred for the system of FIG. 1, it is desirable to use a different cathode structure, such as a flat disk coated with barium oxide or another low workfunction material. Such an electron source is similar to the technology used in CRTs, but such a high-current source has not to date been utilized for focused beams in semiconductor inspection or metrology.

Resolution (dependent on spot size) for the system of FIG. 1 may typically be from 10 microns to 1 millimeter, preferably at least 100 microns. A spot size greater than 0.5 microns in diameter is larger than spot sizes used in prior automated e-beam inspectors.

In an additional mode, the e-beam may have a larger spot size of about 10 millimeters, which is roughly equivalent to the size of a typical die. Depending on the beam current and averaging used, wafer scan times may range, for example, from less than a second to a few minutes.

In one embodiment, an adaptive procedure may be utilized, whereby areas of interest on the wafer are first quickly located with a very coarse beam. These smaller areas are then scanned at increasing resolutions until the desired detailed information on a particular area is obtained.

The resulting images may be post-processed to correct any minor wafer misalignment. The resulting aligned images can either be compared to known good images, or to a theoretical map. In addition, dies or regions on one wafer may be compared to other dies or regions on the same wafer.

A number of variations of the above-discussed macro e-beam inspector 100 may be implemented. For example, a grid (similar to a shadow mask in a CRT) may be placed just above the wafer to either enhance the resolution or to control the field above the wafer surface.

The above-described e-beam inspector 100 may also be extended to utilize multiple beams at low cost (due to the low cost of CRT gun technology). The use of multiple beams is advantageous in terms of increased throughput and also in maintaining a more consistent vertical landing angle across the entire wafer.

In one embodiment, the above-described e-beam inspector 100 may be advantageously integrated into another semiconductor manufacturing tool. Such integration would provide an in-situ metrology capability within the other tool. The other tool may comprise, for example, an etching type tool or a deposition type tool.

Figure 2:
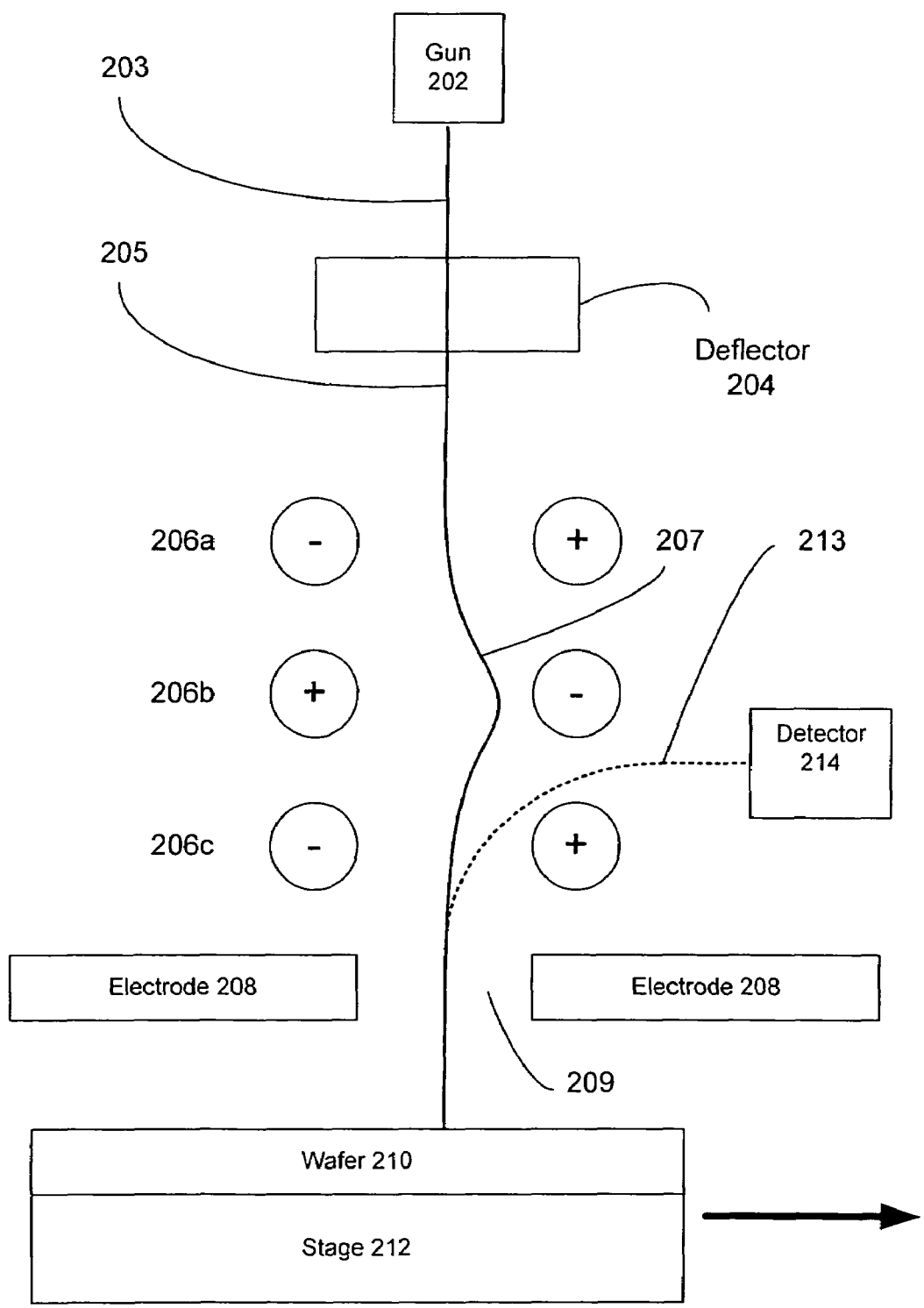
FIG. 2 is a schematic diagram of a first, high-speed one-dimensional scanning apparatus for use with a one-dimensional moving stage in accordance with an embodiment of the invention.

FIG. 2 is a cross-sectional schematic diagram of a first high-speed one-dimensional scanning apparatus 200 for use with a one-dimensional moving stage in accordance with a first embodiment of the invention. An electron gun 202 produces an incident electron beam 203, and a scanning deflector 204 deflects said beam in a one-dimensional scan to produce a scanned beam 205. In FIG. 2, the scanning deflector 204 deflects the beam in a dimension in-and-out of the plane of the page. The scanning deflector 204 may be implemented, for example, with a controlled electrostatic deflector. In other words, the trajectory of the scanned beam 205 is deflected such that the scanning occurs in a dimension in-and-out of the plane of the page.

In accordance with the embodiment of FIG. 2, a series of electrostatic deflectors 206 temporarily deflects 207 the scanned beam 205, but the series deflectors 206 are configured such that the temporary deflection 207 is substantially reversed by the time that the series of deflectors 206 are passed, such that the trajectory 205 prior to the series of deflectors 206 is resumed.

The apparatus 200 may be configured with an electrode 208 above the wafer 210. The electrode 208 may be configured as a plate with a slot 209 therein. The slot 209 is oriented along the scanning direction. The electrode 208 may be set at a voltage potential so as to facilitate extraction of secondary or other scattered electrons 213 from the wafer surface. The series of deflectors 206 is configured such that the extracted electrons 213 are deflected out of the path of the incident beam 205 and towards a detector 214.

The stage 212 holding the wafer 210 comprises a moving stage that translates the wafer 210 in the direction shown (to the right in the drawing). Thus, while the scanning of the wafer 210 is in the dimension in-and-out of the plane of the page, the translation of the wafer is in the horizontal direction of the figure.

Figure 3:
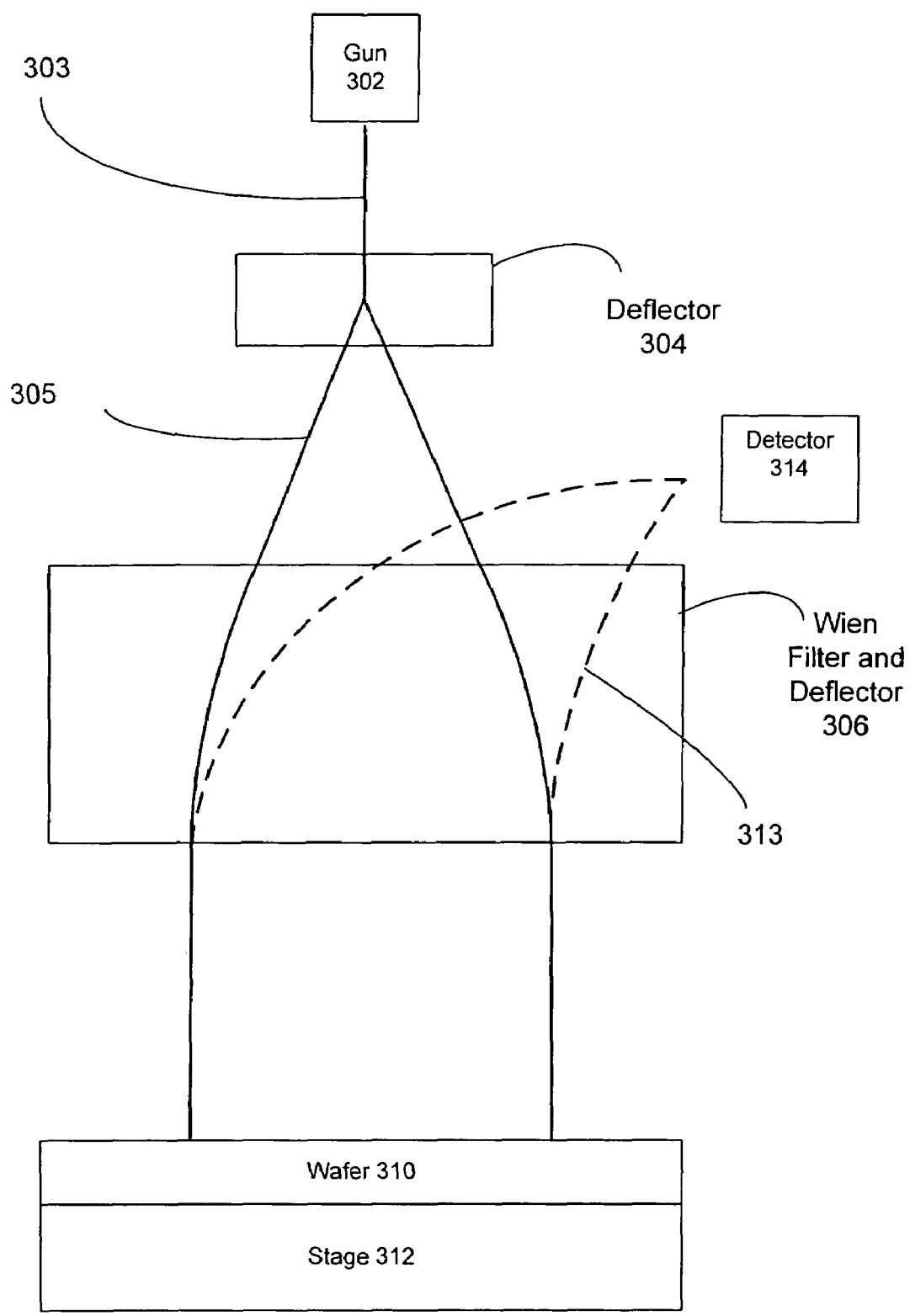
FIG. 3 is a schematic diagram of a second high-speed one-dimensional scanning apparatus for use with a one-dimensional moving stage in accordance with an embodiment of the invention.

FIG. 3 is a cross-sectional schematic diagram of a second high-speed one-dimensional scanning apparatus 300 for use with a one-dimensional moving stage in accordance with an embodiment of the invention. An electron gun 302 produces an incident electron beam 303, and a scanning deflector 304 deflects said beam in a one-dimensional scan to produce a scanned beam 305. In FIG. 3, the scanning deflector 304 deflects the beam to the left and right in the figure. The scanning deflector 304 may be implemented, for example, with a controlled electrostatic deflector. In other words, the trajectory of the scanned beam 305 is deflected such that the scanning occurs in the horizontal dimension of the figure.

In accordance with the embodiment of FIG. 3, a combined Wien filter and deflector unit 306 then directs the scanned beam 305 towards the wafer 310. The Wien filter/deflector 306 is configured to produce both magnetic and electrostatic fields. Because the force caused by the magnetic field on charged-particle trajectories depends upon the velocity direction (and speed) of the charged-particles, the Wien filter/deflector 306 has a different effect on electrons in the incident beam 305 than on secondary or scattered electrons 313. The Wien filter/deflector 306 may be advantageously configured so as to deflect the scattered electron beam 313 towards a detector 314.

The apparatus 300 may also be configured with an electrode (not depicted) above the wafer 310. The electrode may be configured as a plate with a slot therein. The slot is oriented along the scanning direction. The electrode may be set at a voltage potential so as to facilitate extraction of secondary or other scattered electrons 313 from the wafer surface.

The stage 312 holding the wafer 310 comprises a moving stage that translates the wafer 310 in a direction perpendicular to the scanning direction. Thus, while the scanning of the wafer 310 is in the horizontal dimension of the figure, the translation of the wafer is in the direction in or out of the plane of the page.

Figure 4:
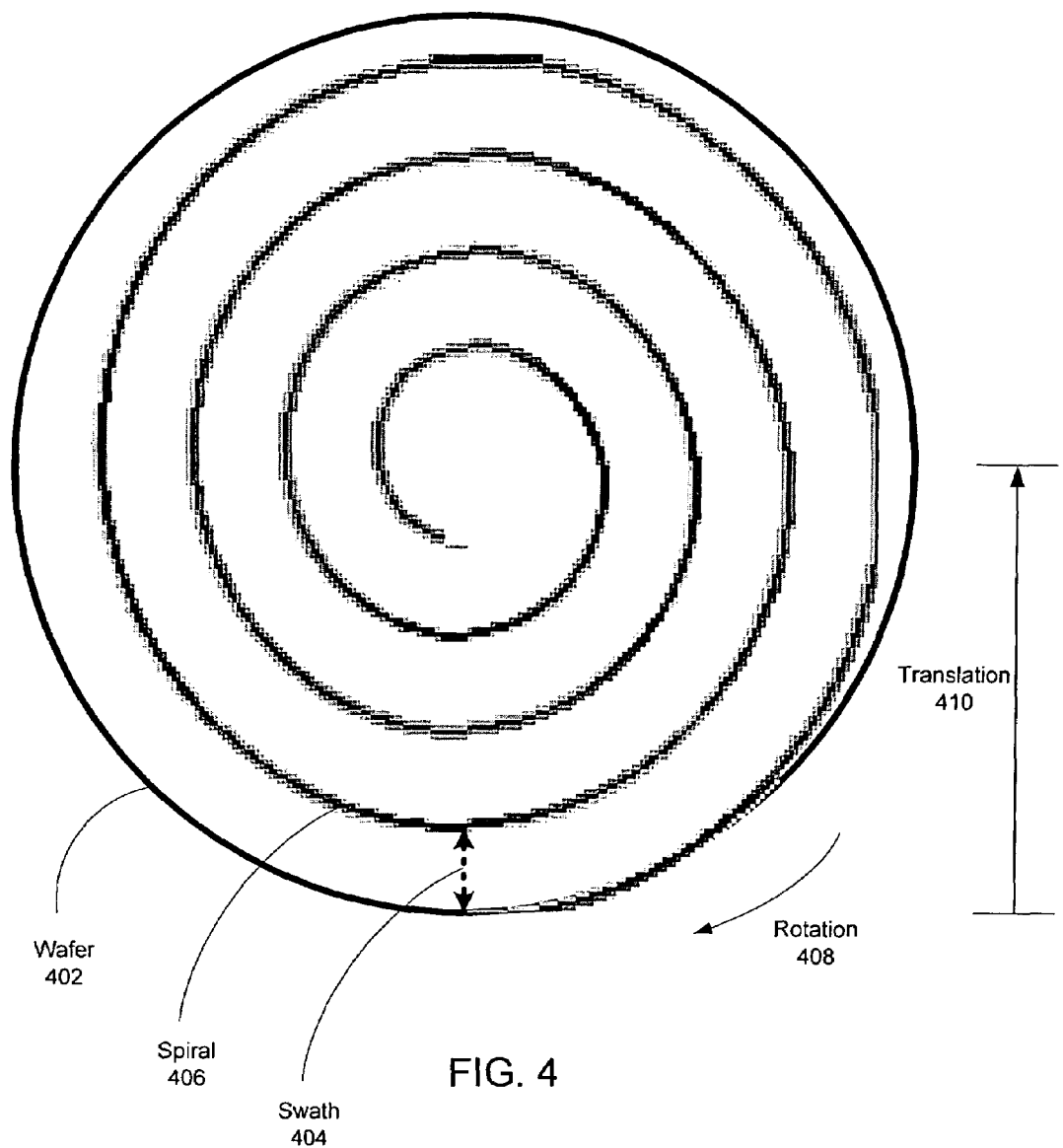
FIG. 4 is a schematic diagram of a high-speed swath scan of a wafer using a spiral path in accordance with an embodiment of the invention.

FIG. 4 is a schematic diagram of a high-speed swath scan of a wafer 402 using a spiral path 406 in accordance with an embodiment of the invention. In accordance with this embodiment, the apparatus may comprise a more conventional electron beam column, but the stage comprises a spiral-motion (r-θ) stage to facilitate the rapid scanning.

The incident electron beam is scanned along a swath 404. The length of the swath 404 is preferably just a fraction of the radius of the wafer. While the scanning is confined to a relatively small swath 404, the desired area of the wafer 402 is covered by simultaneous rotational 408 and translational 410 motion of the stage holding the wafer 402. The spot size for the incident beam may typically be 0.5 microns or larger.

In the example shown in FIG. 4, the rotation 408 is clockwise and the simultaneous translation 410 is in the up direction in the page. In this way, the spiral path 406 illustrated in FIG. 4 is achieved, and substantially all or all of the wafer surface may be rapidly inspected. While FIG. 4 shows the spiral going from the outer circumference of the wafer towards the center of the wafer, an alternate embodiment may achieve a path going from the center of the wafer towards the outer circumference.

Applications of the above-discussed high-speed e-beam inspection include, but are not limited to, determinations of contact or via etch uniformity, contact or via size, gate oxide leakage, gate oxide breakdown, junction leakage, field oxide quality or uniformity, interlayer dielectric (ILD) quality or uniformity, chemical mechanical planarization (CMP) thickness uniformity, and resist process uniformity. The high-speed inspection may also be applied to detection of large particles, or scratches, or missing patterns.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam apparatus for inspection or metrology of a semiconductor wafer, the apparatus comprising:
    an electron gun configured to generate an electron beam;
    a scanning mechanism configured to scan the electron beam over a surface of the wafer;
    a stage for holding the wafer;
    a scattered electron detector configured to detect scattered electrons generated by impingement of the electron beam onto the wafer surface; and
    a substrate current monitor configured to detect an electrical current from the wafer,
    wherein substantially an entire surface of the wafer is scanned without moving the stage,
    wherein the electron gun comprises a high-current source.

2. The electron beam apparatus of claim 1, wherein the electron beam has a current of at least one microamperes.

3. The electron beam apparatus of claim 1, wherein the high-current source comprises a disk coated with a low workfunction material.

4. The electron beam apparatus of claim 3, wherein the low workfunction material comprises barium oxide.

5. The electron beam apparatus of claim 1, further comprising:
    a vacuum chamber configured to enclose the wafer under inspection; and
    a gate valve configured between the electron gun and the vacuum chamber.

6. The electron beam apparatus of claim 1, further comprising:
    a video capture board configured to receive signals from both the scattered electron detector and the substrate current monitor.

7. The electron beam apparatus of claim 6, further comprising:
    a processor configured to process the signals from both the scattered electron detector and the substrate current monitor so as to map wafer properties.

8. The electron apparatus of claim 7, wherein the processor is configured to map wafer properties which are other than those pertaining to contact or via holes of the wafer.

9. The electron apparatus of claim 8, wherein the processor is configured to map wafer properties which include gate breakdown or junction leakage.

10. A method for automated inspection of a semiconductor wafer using an electron beam, the method comprising:
    using a cathode ray tube gun to generate an electron beam and to scan the electron beam over an entire surface of the wafer;
    using a stationary stage during the scanning of the wafer surface; and
    generating a map of wafer properties from a combination of a secondary electron current signal and a substrate current signal.

11. An electron beam apparatus for high-speed inspection of a semiconductor wafer, the apparatus comprising:
    an electron gun configured to generate an incident electron beam;
    a scanning deflector configured to scan the incident electron beam in one dimension;
    a stage configured to hold the wafer and to rotate the wafer in a direction that is perpendicular to the dimension of the scanning;
    a mechanism for translation of the stage while the wafer is being rotated;
    a mechanism for directing scattered electrons away from the incident electron beam and to a detector; and an electrode plate configured between the wafer and the mechanism for directing scattered electrons away from the incident electron beam, wherein the electrode plate has an opening aligned with the scanning dimension through which the incident beam passes.

12. The electron beam apparatus of claim 11, wherein the mechanism for directing scattered electrons away from the incident electron beam comprises a series of electrostatic deflectors.

13. The electron beam apparatus of claim 11, wherein the mechanism for directing scattered electrons away from the incident electron beam comprises a combined Wien filter and deflector.

14. An electron beam apparatus for high-speed inspection of a semiconductor wafer, the apparatus comprising:

an electron gun configured to generate an incident electron beam;

a scanning deflector configured to scan the incident electron beam in one dimension; and a stage configured to hold the wafer and to rotate the wafer in a direction that is perpendicular to the dimension of the scanning; and a mechanism for translation of the stage while the wafer is being rotated.

15. The electron beam apparatus of claim 14, wherein the scanning of the incident electron beam forms a swath, and wherein the swath is translated along a spiral over a substantial portion of the wafer.

16. A method for high-speed electron-beam inspection of a semiconductor wafer, the method comprising:

generating an incident electron beam;

scanning the incident electron beam in one dimension;

rotating the wafer in a direction that is perpendicular to the dimension of the scanning;

translating the stage while the wafer is being rotated; and directing scattered electrons away from the incident electron beam and to a detector.

* * * * *